US007652270B2

(12) United States Patent
Dzengeleski et al.

(10) Patent No.: US 7,652,270 B2
(45) Date of Patent: Jan. 26, 2010

(54) TECHNIQUES FOR ION BEAM CURRENT MEASUREMENT USING A SCANNING BEAM CURRENT TRANSFORMER

(75) Inventors: Joseph P. Dzengeleski, Newton, NH (US); Costel Biloiu, Rockport, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 329 days.

(21) Appl. No.: 11/758,236

(22) Filed: Jun. 5, 2007

(65) Prior Publication Data

US 2008/0302955 A1   Dec. 11, 2008

(51) Int. Cl.
*G21G 5/00*   (2006.01)
*G03F 7/20*   (2006.01)

(52) U.S. Cl. .................. 250/492.21; 250/396 ML; 250/396 R; 250/397; 250/398; 250/492.3

(58) Field of Classification Search .......... 250/396 ML, 250/396 R, 397, 398, 492.21, 492.3
See application file for complete search history.

(56) References Cited

U.S. PATENT DOCUMENTS

| | | | | |
|---|---|---|---|---|
| 3,857,090 | A * | 12/1974 | Chick | 324/71.3 |
| 4,021,636 | A * | 5/1977 | von Walter | 219/121.34 |
| 4,172,243 | A * | 10/1979 | Daugherty et al. | 336/60 |
| 4,361,762 | A * | 11/1982 | Douglas | 250/251 |
| 4,675,530 | A * | 6/1987 | Rose et al. | 250/492.2 |
| 4,687,987 | A * | 8/1987 | Kuchnir et al. | 324/71.3 |
| 4,816,693 | A * | 3/1989 | Rathmell | 250/492.2 |
| 4,943,769 | A * | 7/1990 | Golladay et al. | 324/751 |
| 5,331,161 | A * | 7/1994 | Ohdomari et al. | 850/63 |
| 5,475,228 | A * | 12/1995 | Palathingal | 250/397 |
| 5,532,495 | A * | 7/1996 | Bloomquist et al. | 250/492.21 |
| 6,933,507 | B2 * | 8/2005 | Purser et al. | 250/396 ML |
| 6,992,308 | B2 * | 1/2006 | Graf et al. | 250/492.21 |
| 7,161,352 | B2 * | 1/2007 | Sasaki | 324/248 |
| 7,301,156 | B2 * | 11/2007 | Purser et al. | 250/396 ML |

OTHER PUBLICATIONS

Tumanski, Slawomir, Induction Coil Sensors—A Review, Measurement Science and Technology, 18 (2007), pp. R31-R46, IOP Publishing Ltd., UK.
Dunn, Peter, C., Absolute Beam Charge Measurements With Toroid Monitors: Experience at the Bates Linac, Nuclear Instruments and Methods 165 (1979) pp. 163-167, North-Holland Publishing Co. Middleton, MA, USA.

* cited by examiner

*Primary Examiner*—David A Vanore

(57) ABSTRACT

Techniques for ion beam current measurement using a scanning beam current transformer are disclosed. In one particular exemplary embodiment, the techniques may be realized as an apparatus for ion beam current measurement using a transformer. The apparatus may comprise a measurement device positioned adjacent a wafer and an ion dose control module coupled to the measurement device. The measurement device may comprise a transformer through which an ion beam passes onto the wafer. The ion dose control module may calculate ion beam current passing through the transformer and adjust dose based at least in part upon the calculated ion beam current.

16 Claims, 11 Drawing Sheets

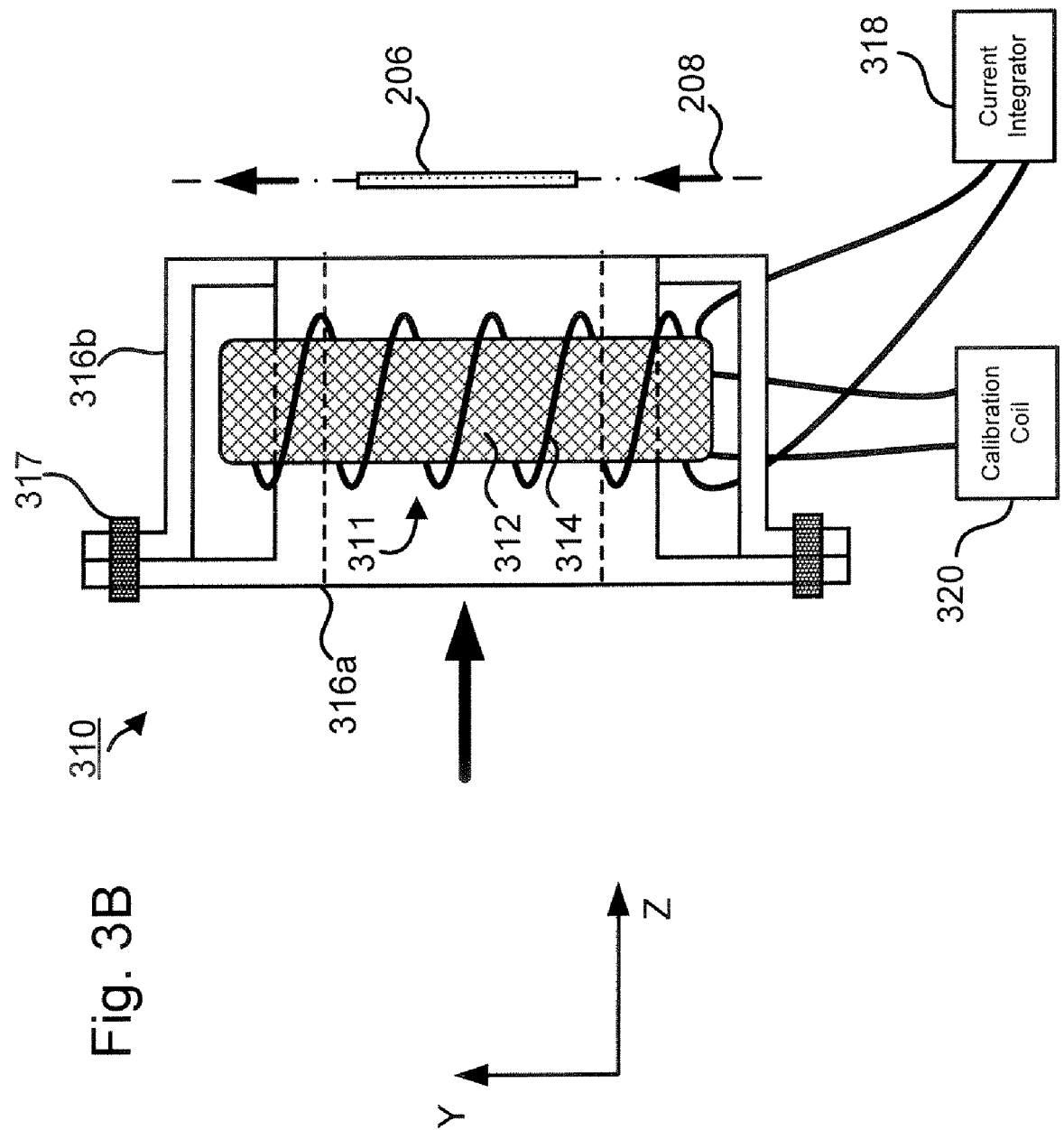

TECHNIQUES FOR ION BEAM CURRENT MEASUREMENT USING A SCANNING BEAM CURRENT TRANSFORMER

FIELD OF THE DISCLOSURE

The present disclosure relates generally to ion implantation and, more particularly, to techniques for ion beam current measurement using a scanning beam current transformer.

BACKGROUND OF THE DISCLOSURE

Ion implantation is a process of depositing chemical species into a substrate by direct bombardment of the substrate with high-energy ions. In semiconductor fabrication, ion implanters are used primarily for doping processes that alter the type and level of conductivity of target materials. A precise doping profile in an integrated circuit (IC) substrate and its thin-film structure is often crucial for proper IC performance. To achieve a desired doping profile, one or more ion species may be implanted in different doses and at different energy levels. A specification of the ion species, doses and energies is referred to as an ion implantation recipe.

In conventional ion implantation, ions are extracted from a plasma source and are typically filtered (e.g., for mass, charge, energy, etc.), accelerated and/or decelerated, and collimated through several electro-static/dynamic lenses before being directed to a substrate. FIG. 1 depicts a conventional ion implanter system 100. As is typical for most ion implanter systems, the system 100 is housed in a high-vacuum environment. The ion implanter system 100 may comprise an ion source 102 and a complex series of components through which an ion beam 10 passes. The series of components may include, for example, an extraction manipulator 104, a filter magnet 106, an acceleration or deceleration column 108, an analyzer magnet 110, a rotating mass slit 112, a scanner 114, and a corrector magnet 116. Much like a series of optical lenses that manipulate a light beam, the ion implanter components may filter and focus the ion beam 10 before steering it towards a target wafer 120 (located in a wafer plane 12).

A number of measurement devices, such as a dose control Faraday cup 118, a traveling Faraday cup 124, and a setup Faraday cup 122, may be used to monitor and control the ion beam conditions. Specifically, measurement of ion dose rate in the ion implantation system 100 may be accomplished using these one or more measurement devices. Because incident ion flux may be measured as an electrical current, the ion dose rate of the target wafer 120 may be calculated by dose count electronics (DCE) (not shown) by taking a measured electrical current and dividing by an aperture area of the one or more measurement devices.

In the design and operation of an ion implanter, ion dose uniformity and ion beam utilization are major concerns since they directly impact the productivity of the ion implanter.

To achieve a uniform distribution of dopants, an ion beam is typically moved across the surface of a target wafer during an implantation process. FIG. 2A shows a typical setup for continuous implantation with an ion beam. In an ion implanter system, e.g., a scanned beam implanter, an ion beam spot 202 may be swept horizontally (i.e., in the X direction) along a scan path 204 across the surface of a wafer 206. A dose control Faraday cup 210 may be used to measure ion beam current. At the same time, the wafer 206 may be translated vertically along a path 208 (i.e., in the Y direction) through a process chamber. Thus, the ion beam spot 202 is scanned with respect to the wafer 206 in both the X and Y directions. The net effect of the movement of the ion beam spot 202 in the X and Y directions is a beam path 20, as depicted in FIG. 2B, that zigzags across the entire surface of the wafer 206 as well as its surrounding area. Since the ion beam spot 202 moves completely off the wafer 206 in each sweep, the total area covered by the ion beam spot 202 may be approximated with a box 22, which may be substantially larger than the wafer 206.

However, the traditional implantation method as illustrated in FIGS. 2A and 2B has a number of problems. For example, such a method often assumes that the ion beam spot 202 maintains the same profile and delivers the same dose at any location. Because conventional measurement devices, e.g., the dose control Faraday cup 118, the traveling Faraday cup 124, and the setup Faraday cup 122, are either intercepting or situated at the side of the wafer 206, the actual ion beam current, and therefore ion dose uniformity, at the wafer 206 may not be accurately measured or determined.

Furthermore, secondary electrons are typically produced upon energetic ion bombardment on these measurement devices. If secondary electrons are not suppressed or confined, most of these electrons may end up colliding with other components of the system 100, which may cause sputtering or heating up of these components or may interfere with the accuracy of ion beam current measurements. Consequently, the accuracy of measuring implant dose is greatly affected by unconfined secondary electrons.

Additionally, in the traditional method, the ion beam spot 202, in its scan path 204, may go completely off the wafer edge in each sweep, which is known as a "full overscan." Full overscans are deemed necessary to provide a uniform ion dose even at the edges of the wafer 206 and to allow real-time monitoring of ion beam conditions at measurement devices. If the spot size is small, the ion beam is off the wafer surface only briefly. However, if the spot size is large (e.g., greater than about a quarter of the wafer size), as is often the case for low-energy ion beams, the ion beam spot spends almost as much, if not more, time off the wafer as it does on the wafer. As a result, beam utilization becomes extremely low for a low-energy ion beam that is scanned fully off the wafer.

In view of the foregoing, it may be understood that there are significant problems and shortcomings associated with current ion implantation technologies.

SUMMARY OF THE DISCLOSURE

Techniques for ion beam current measurement using a transformer are disclosed. In one particular exemplary embodiment, the techniques may be realized as an apparatus for ion beam current measurement using a scanning beam current transformer. The apparatus may comprise a measurement device positioned adjacent a wafer and an ion dose control module coupled to the measurement device. The measurement device may comprise a transformer through which an ion beam passes onto the wafer. The ion dose control module may calculate ion beam current passing through the transformer and adjust dose based at least in part upon the calculated ion beam current.

In accordance with other aspects of this particular exemplary embodiment, the ion dose control module may comprise a current integrator to calculate the ion beam current passing through the transformer.

In accordance with further aspects of this particular exemplary embodiment, the ion dose control module may further control movement of the ion beam across the wafer according to a scan path, wherein the scan path permits the ion beam to sweep beyond an inner periphery of the transformer.

In accordance with additional aspects of this particular exemplary embodiment, the apparatus may further comprise a calibration coil, coupled to the measurement device, to provide simulated ion beam current for calibrating the ion dose control module.

In accordance with further aspects of this particular exemplary embodiment, the transformer may comprise a core with a coil wrapped around the core and a casing for the transformer, wherein the casing may includes electrically conductive, non-magnetic material.

In accordance with additional aspects of this particular exemplary embodiment, the transformer may be in the shape of an annular toroid, a rectangular toroid, or an elliptical toroid.

In accordance with further aspects of this particular exemplary embodiment, the ion beam current may be measured in real-time.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

FIGS. 3A-3B depict an exemplary scanning beam current transformer configuration in accordance with an embodiment of the present disclosure.

DETAILED DESCRIPTION OF EXEMPLARY EMBODIMENTS

Embodiments of the present disclosure provide an ion implantation solution that improves ion beam current measurement and monitoring using a scanning beam current transformer for optimizing ion beam utilization while maintaining uniform ion dose.

Figure 1:
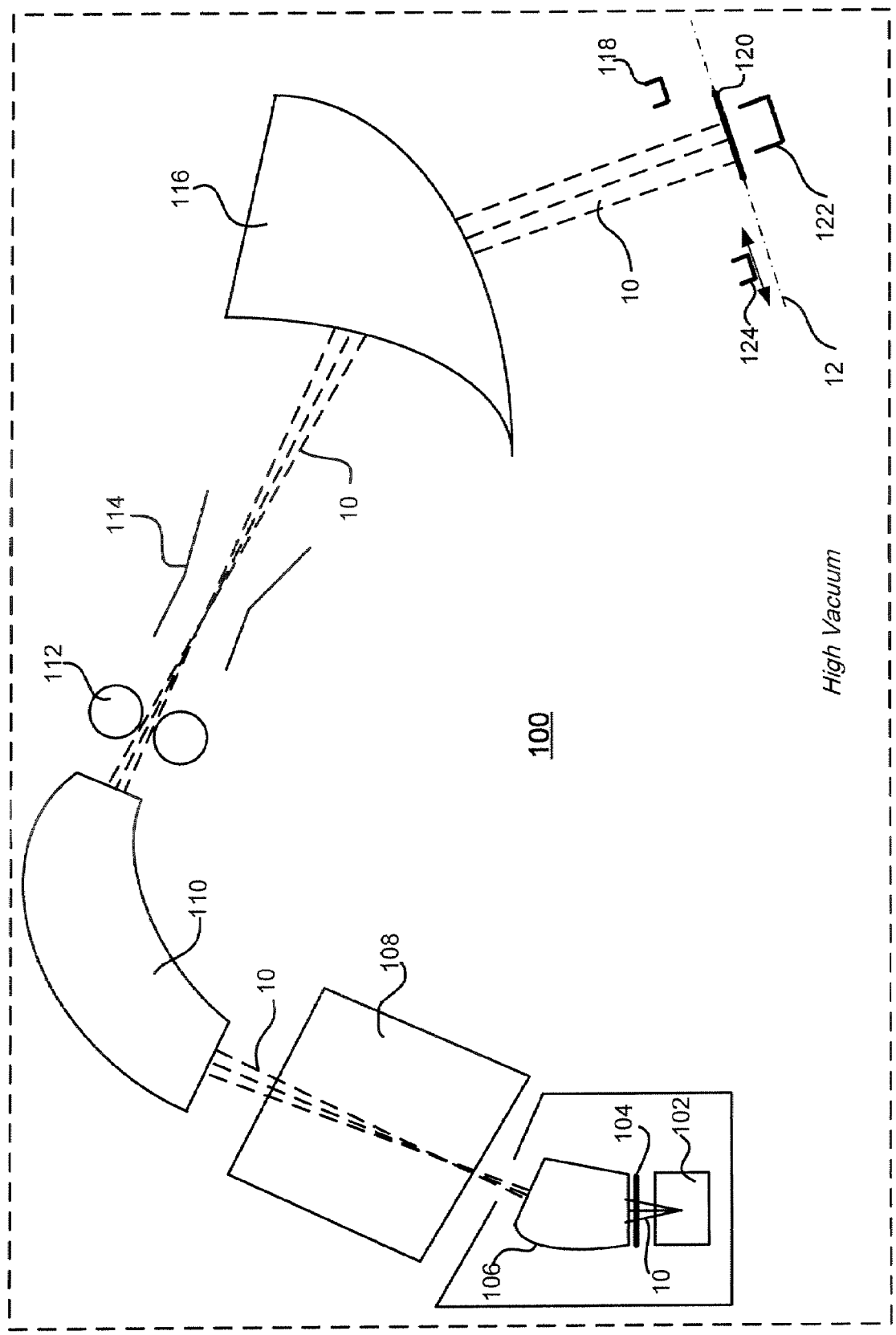
FIG. 1 depicts a conventional ion implanter system.
Figure 2A:
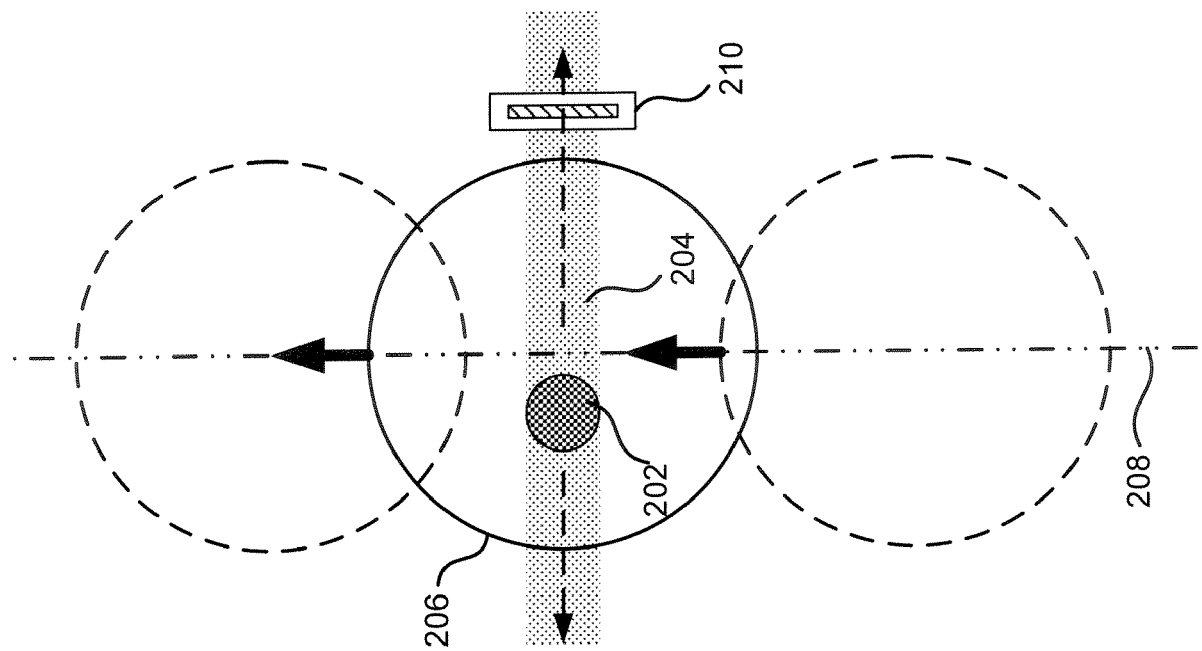
FIGS. 2A-2B depict a conventional setup for scanning a wafer with an ion beam.
Figure 2A:
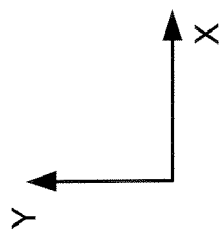
Figure 2B:
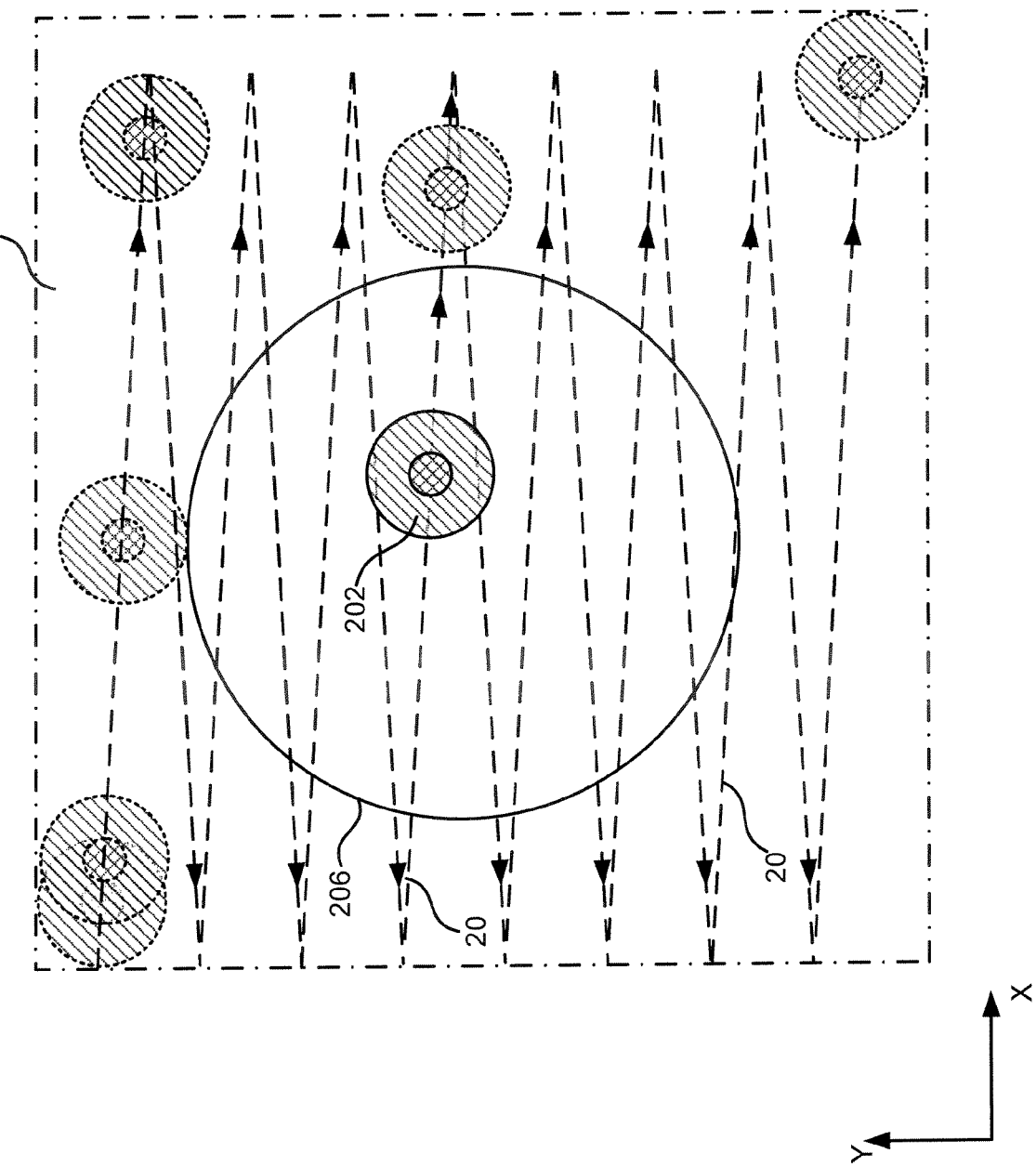
Figure 3A:
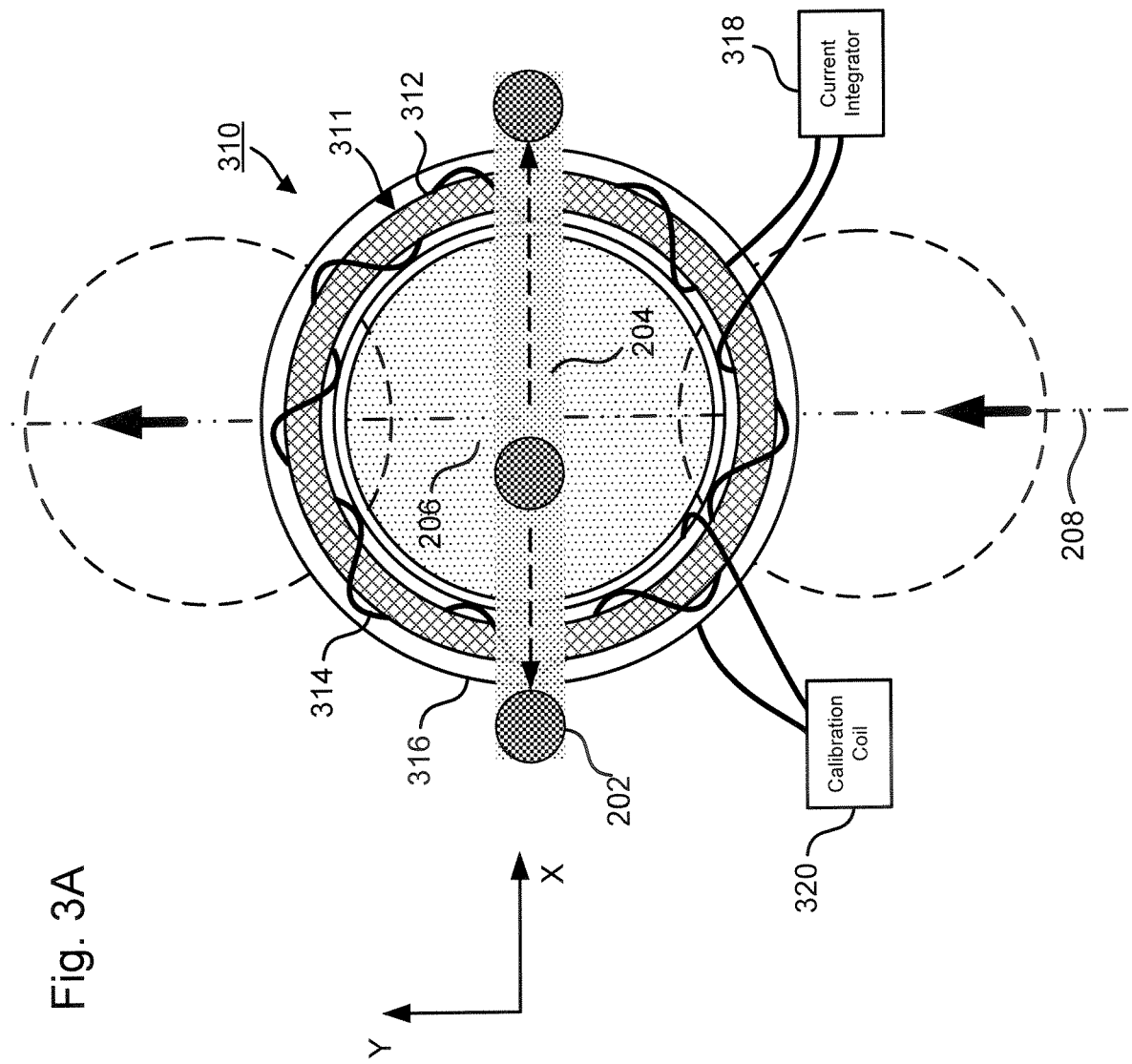

Referring to FIG. 3A, a top view of a current monitor 310 is shown in accordance with an embodiment of the present disclosure. In one embodiment, the current monitor 310 may include a scanning beam current monitor. The current monitor 310 may include a transformer 311 having a core 312 and a coil 314 wrapped around the core 312. The core 312 may be in the shape of an annulus or a toroid and may be positioned within a transformer casing 316. The transformer casing 316 may be formed of an electrically conductive, non-magnetic material, such as graphite or aluminum, and may be used as a shield or protective covering for the transformer 311. Another role of the transformer casing 316 may be to ensure that induced magnetic flux links the minor turns of the coil 314 and not the large major turn. Additionally, eventual azimuthal currents induced in the transformer casing 316 by an axial component of the induced magnetic field (e.g., in the case of slight deviations from perpendicularity of the scanning beam on coil plane) may cancel the azimuthal components of the flux in the transformer casing 316. In one embodiment, the core 312 may be fabricated of high magnetic permeability material, e.g., Vitrovac®, μmetal, or other similar material, and the coil 314 may be fabricated of a ferroelectric and/or conductive material, e.g., copper or other similar material. Other various materials may also be utilized.

Figure 7:
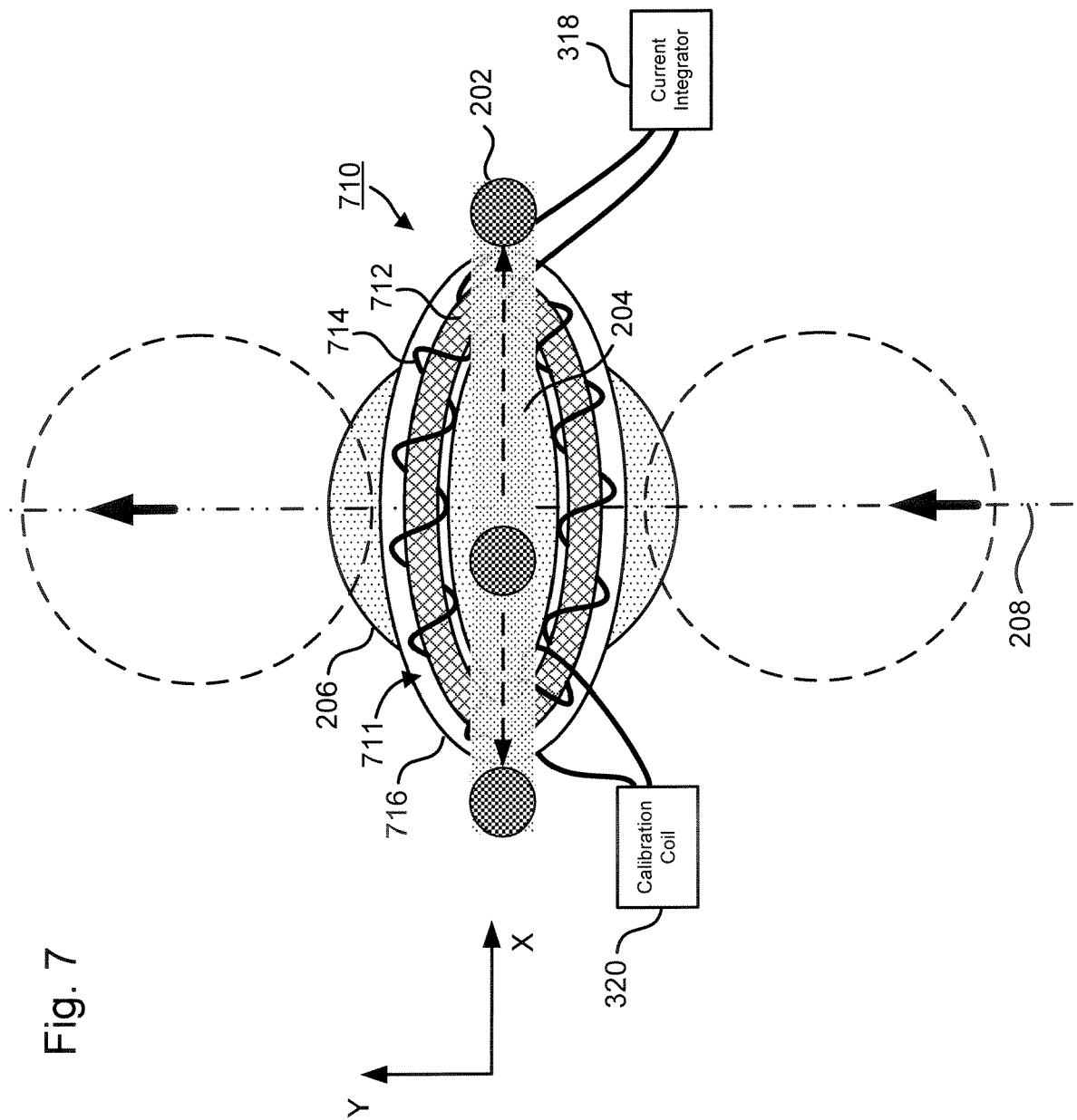
FIG. 7 depicts an exemplary scanning beam current transformer configuration in accordance with an embodiment of the present disclosure.

The current monitor 310 may be connected to a current integrator 318 through wires of the coil 314. Additionally, the current integrator 318 may be connected to a dose control system 700, as depicted in FIG. 7. Alternatively, in another embodiment, the current integrator 318 may be connected to the dose control system 700 through a feedback loop to compensate for dose variations during ion implantation.

A calibration coil 320 may wrap around the current monitor 310. In one embodiment, the calibration coil 320 may include a single turn and provide the current monitor 310 with a simulated beam current, which may be useful for calibrating the current monitor 310. In another embodiment, the calibration coil 320 may include a predetermined number of turns for more reliable and accurate calibration.

Referring to FIG. 3B, a side view of the current monitor 310 is shown in accordance with an embodiment of the present disclosure. In this embodiment, the transformer casing 316 may include an inner casing 316a and an outer casing 316b. One or more fasteners 317 may hold the inner casing 316a and the outer casing 316b together to secure the transformer 311, which may be fitted within the inner casing 316a. In one embodiment, the inner casing 316a and the outer casing 316b may be formed of the same electrically conductive, non-magnetic material, e.g., graphite or aluminum. In another embodiment, the inner casing 316a and the outer casing 316b may be formed of different electrically conductive, non-magnetic materials, e.g., the inner casing 316a may be formed of graphite and the outer casing 316b may be formed of aluminum. Other various materials may also be utilized. Furthermore, in yet another embodiment, the transformer casing 316 may be symmetrically grounded. This may ensure a short path to ground as well as no generation of azimuthal currents when the ion beam spot 202 scans across the transformer casing 316.

Referring back to FIG. 3A, as the ion beam spot 202 is be swept horizontally (i.e., in the X direction) along the scan path 204 across the surface of the wafer 206, the current monitor 310 may be used to measure the ion beam current at the wafer 206. At each sweep along the scan path 204, the ion beam spot 202 may cover a distance beyond the outer border of the current monitor 310, as depicted in FIG. 3A. This is particularly important so that the current integrator 318 (and other measurement electronics) may accurately measure the ion beam current through the center of the transformer 311 by sweeping over the inner edge of the transformer casing 316. The basis for calculating ion beam current within the transformer 311 will be discussed in further detail below.

Charges in motion, such as electrical current, may create a magnetic field. For example, according to Biot-Savart law, magnetic field generated by a current element Idl may be expressed as:

$$dB = [(\mu I)/(4\pi)] \cdot [(dl \times r)/r^3],$$

where dB represents the magnetic field induction, $\mu$ represents magnetic permeability of a medium, and r represents a displacement vector.

Figure 4A:
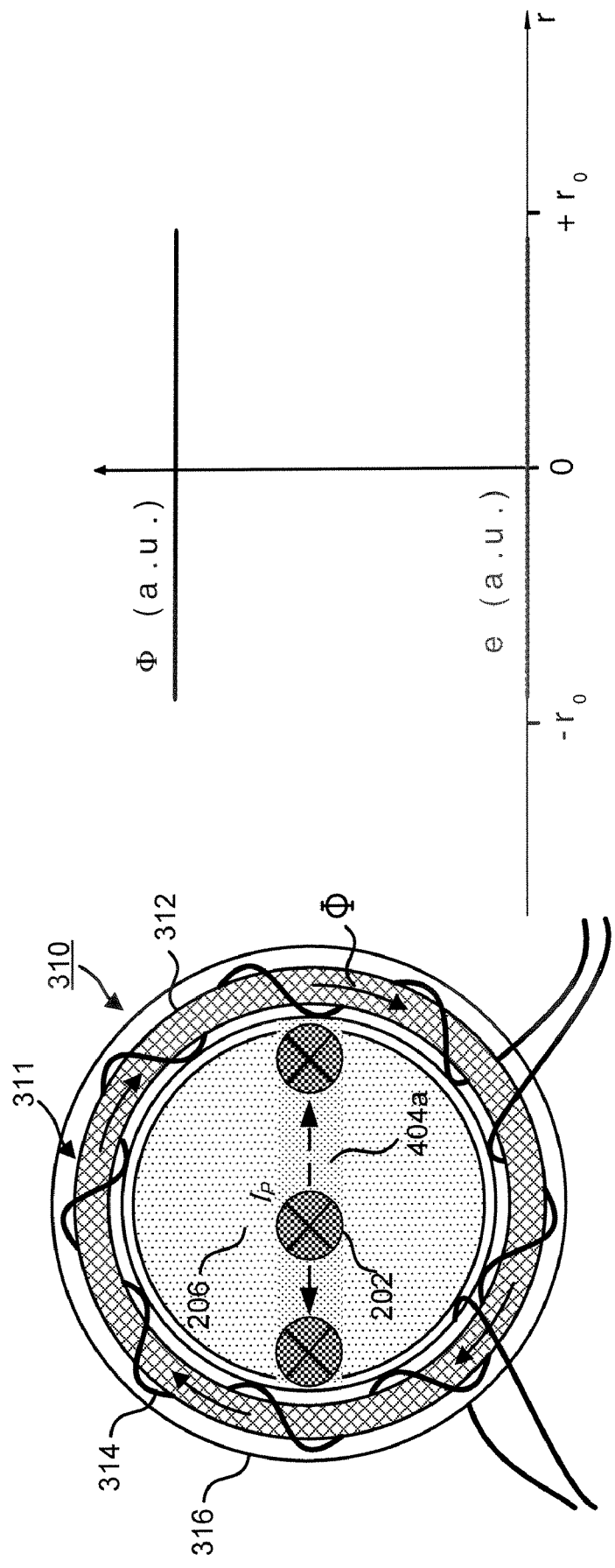
FIG. 4A-4B depict an exemplary graphical representation of induced magnetic flux ($\Phi$) and induced electromotive force (e) for scanning ion beam current in accordance with an embodiment of the present disclosure.

For the geometry of the current monitor 310 (e.g., a toroidal coil, as depicted in FIG. 4A, where a current ($I_p$) perpendicular on the coil plane having a direction entering the paper sheet), the magnetic field induction may have a direction shown on FIG. 4A and may be expressed as:

$$B = (\mu_c I_p)/(2\pi r),$$

where $\mu_c$ represents magnetic permeability of the core 312. Thus, if current ($I_p$) varies with time, the induced magnetic field (B) may also be a function of time. Accordingly, the magnetic flux ($\Phi$) through the core may be expressed as:

$$\Phi(t) = B(t)A,$$

where A represents cross-section area of the core 312. This forms the basis for calculating ion beam current within the transformer 311.

According to Faraday's law, the temporal variation of magnetic flux may then induce an electromagnetic force (e):

$$e = -N(d\Phi/dt),$$

where N represents the number of windings of the coil 314. Therefore, for a toroidal current transformer, e.g., a Rogowski coil, the electromotive force (e) may be expressed as:

$$|e| = [(\mu_c NA)/(2\pi r)] \times [dI_p/dt].$$

When a pulsed primary current, $I_p$, having, for example, a shape provided by a Heaviside function, passes through the aperture of a Rogowski coil, an induced secondary current $I_s$ in the windings of the coil 314 may be expressed as:

$$I_s(t) = (1/N) \cdot \exp[(-R/L)t],$$

where N represents number of windings and (R/L) represents the "droop" rate (the inverse of the time constant). Accordingly, integration of such secondary current, $I_s$, may yield a true value of pulsed primary current, $I_p$.

However, in the case of DC currents, or more specifically for implanting systems for which constant ion beam current for a constant dose during implant may be required, the induced emf (e) may be zero. As a result, the value of $I_p$ may not be readily inferred. For example, as depicted in FIG. 4A, when a scan path 404a does not extend beyond an inner border periphery of the transformer 311, in spite of a nonzero magnetic flux through the core of the coil, the induced emf (e) may be zero since, according to Ampere's law along a contour C (the mean circumference of the coil), $$\oint_C B dl = \sum \mu I_p,$$

there is no variation in the magnetic field induction (B) and no variation (implicit) in the induced magnetic flux ($\Phi$).

Figure 4B:
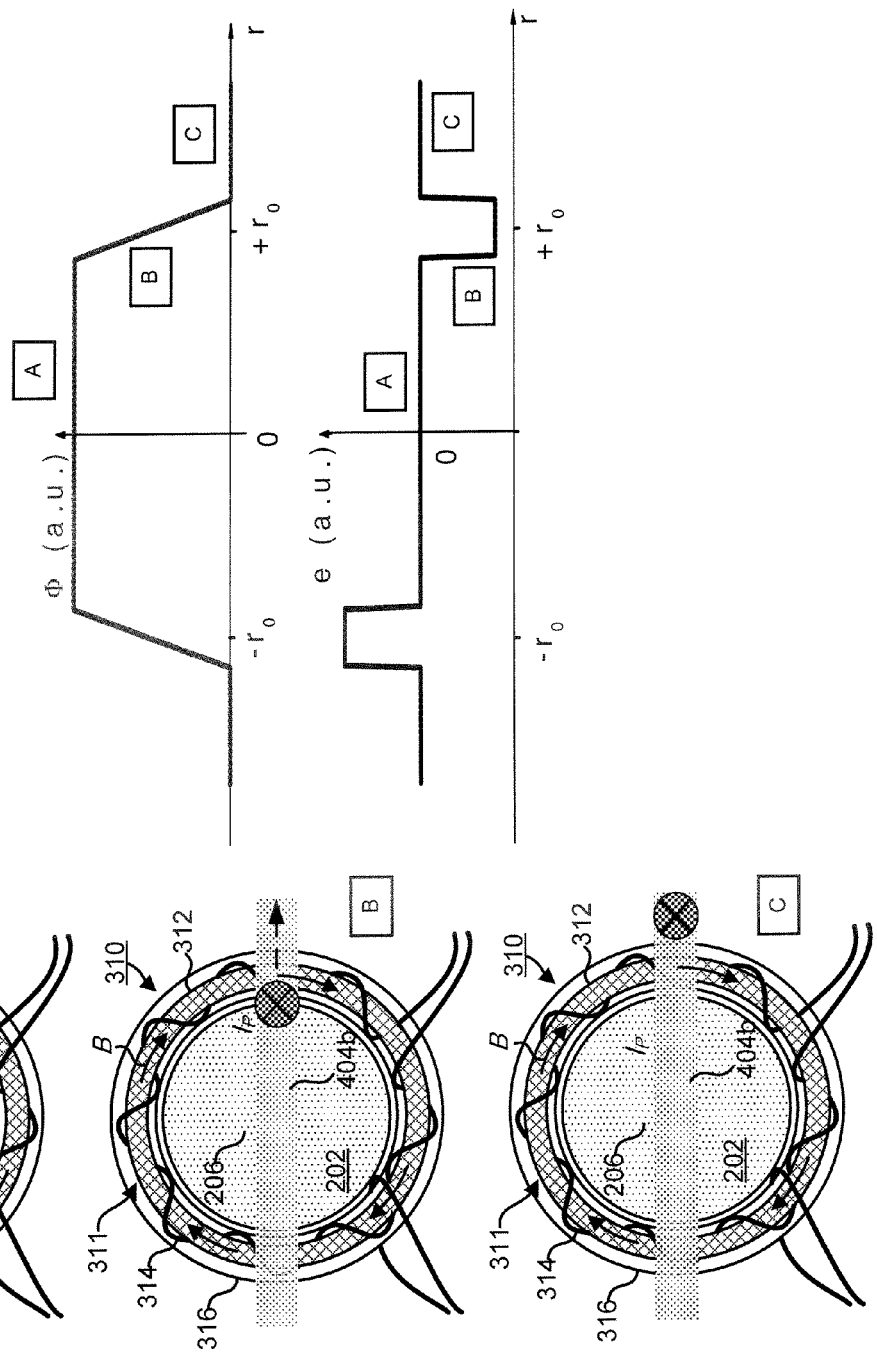

However, as depicted in FIG. 4B, when a scan path 404b extends beyond the inner border periphery of the transformer 311, there may be a variation of primary current, $I_p$, due to its increasing or decreasing cross-section as the beam sweeps across the inner border of the grounded housing containing the core 312. As a result, a temporal variation in the magnetic flux ($\Phi$) and consequently an emf (e) may be induced, as shown in FIG. 4B. Accordingly, integration of the secondary current, $I_s$, may yield a value of the ion beam current at the wafer 206. The secondary current, $I_s$, may be integrated and the ion beam current, $I_p$, at the wafer 206 may be measured. Here, by extending the ion spot beam 202 beyond the outer periphery of the transformer 311, the value of the magnetic field B at the transformer 311 and the value of the electrical current, $I_p$, as shown in FIG. 4B, may provide values for which integration will yield a value for ion beam current at the wafer 206.

For a linear variation of an ion beam current as it sweeps over the inner border periphery of the transformer casing 316, an induced secondary current, $I_s$, may be expressed as:

0, for t<0;

$I_s(t) = I_p(\mu_c N a^2/2 r_0 R \tau) \cdot [1 - \exp(-tR/L)]$, for $0 \leq t < t_0$;

$I_p(\mu_c N a^2/2 r_0 R \tau) \cdot [1 - \exp(-t_0 R/L)] \cdot \exp[-(t-t_0)R/L]$, for $t \geq t_0$;

where $r_0$ and a represent a mean major and a minor radii of a torus, respectively, R represents total resistance (coil+external) viewed by the secondary current, $I_s$, $\tau$ represents a sweeping time across the inner border periphery, L represents the self-inductance of the coil 314, and $t_0$ represents the instant when the ion beam 202 is no longer sensed by the core 312.

Figure 5:
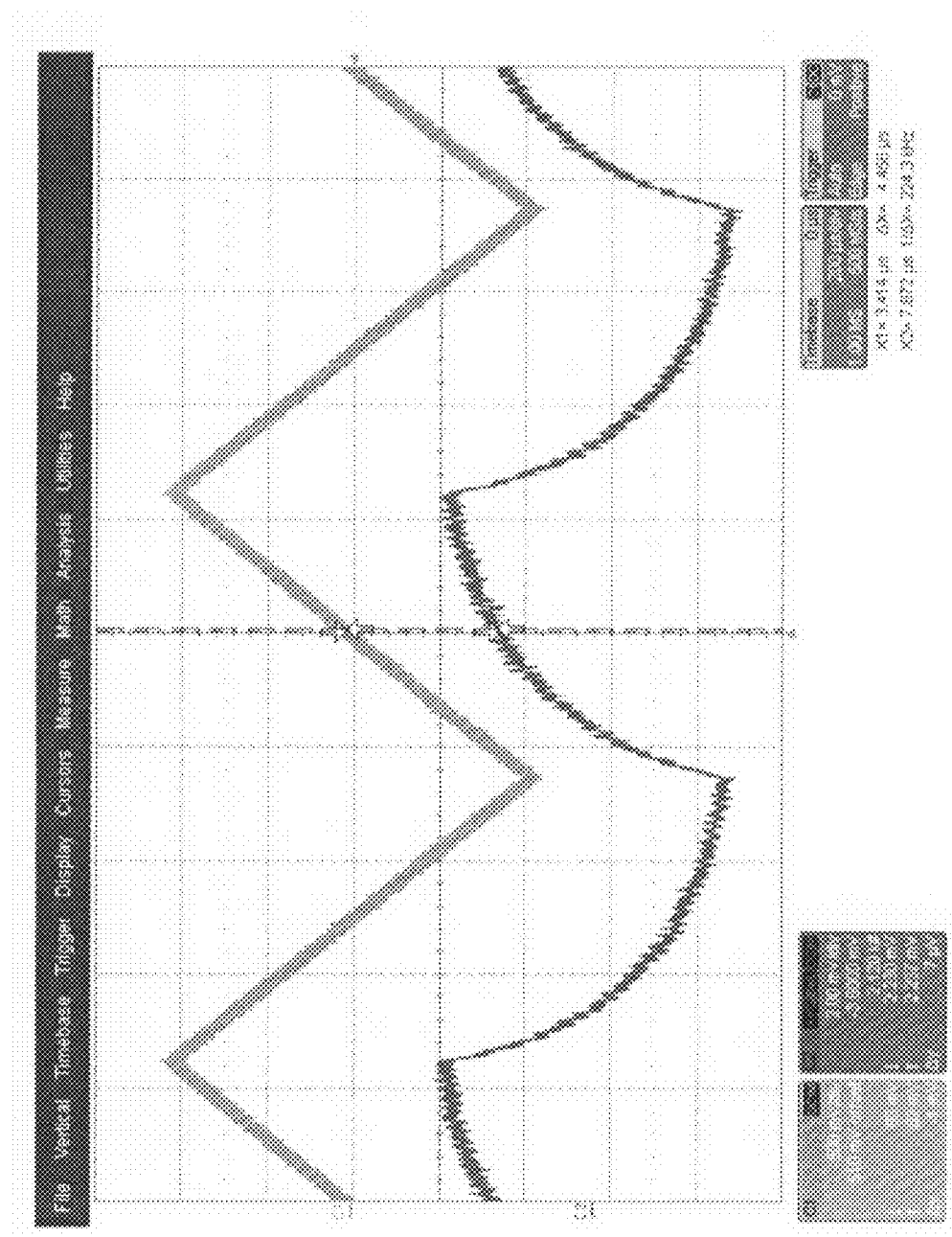
FIG. 5 depicts an exemplary graphical oscillogram representation of primary and secondary current within a transformer in accordance with an embodiment of the present disclosure.

For example, as depicted in FIG. 5, such analytical predictions on a shape of the secondary current, $I_s$, may be reproduced in experimental measurements. Therefore, an integration of the secondary current, $I_s$, as well as a previous accurate calibration, may yield an accurate value of primary current, $I_p$.

In one embodiment, for the particular case of a torus having a mean major radius $r_0 = 6.75$ inches (large enough to encircle a standard 300 mm wafer), a minor radius $a = 0.25$ inches, made of magnetic material having $\mu_r = 1.5 \times 10^5$, theoretical predictions may give a relative magnetic permeability of the core $\mu_c = \sim 1720$ and an optimal number of coil turns $N = \sim 150$. Then, under the approximation of a uniform current density across the beam, the time dependency of the ion beam current as it passes the inner border of the transformer casing 316 may be expressed by:

$$I_p(t) = (I_{p0}/2\pi) \cdot \{\text{Arc Cos}(1 - v_s t/\xi) - (1 - v_s t/\xi) \cdot [(1 - (1 - v t/\xi)^2]^{1/2}\},$$

where $I_{p0}$ represents total ion beam current, $\xi$ represents beam radius, and $v_s$ represents scanning speed. For usual operating parameters in an ion implanter, e.g., ion beam current of ~1 mA, an ion beam diameter of ~5 cm, and a scanning speed of ~1 mm/μs, the induced secondary current amplitude may be ~15 μA. This value may be large enough to be measured (e.g., as a voltage drop on an external resistor), integrated, and further processed to obtain the accurate value of the total ion beam current $I_{po}$ at the wafer 206.

In the illustrated embodiments of the present disclosure, the current monitor 310 is shown with a ring-like (annular) toroidal shape since this geometry may ensure magnetic flux uniformity inside the core 312, minimal transmit time, and improved signal-to-noise ratio. However, a current monitor having other shapes (e.g., elliptical, rectangular, etc.) and sizes may also be utilized, provided that these dimensional factors are taken into account in calculating self-inductance, magnetic flux losses, coil winding uniformity, etc.

Figure 6:
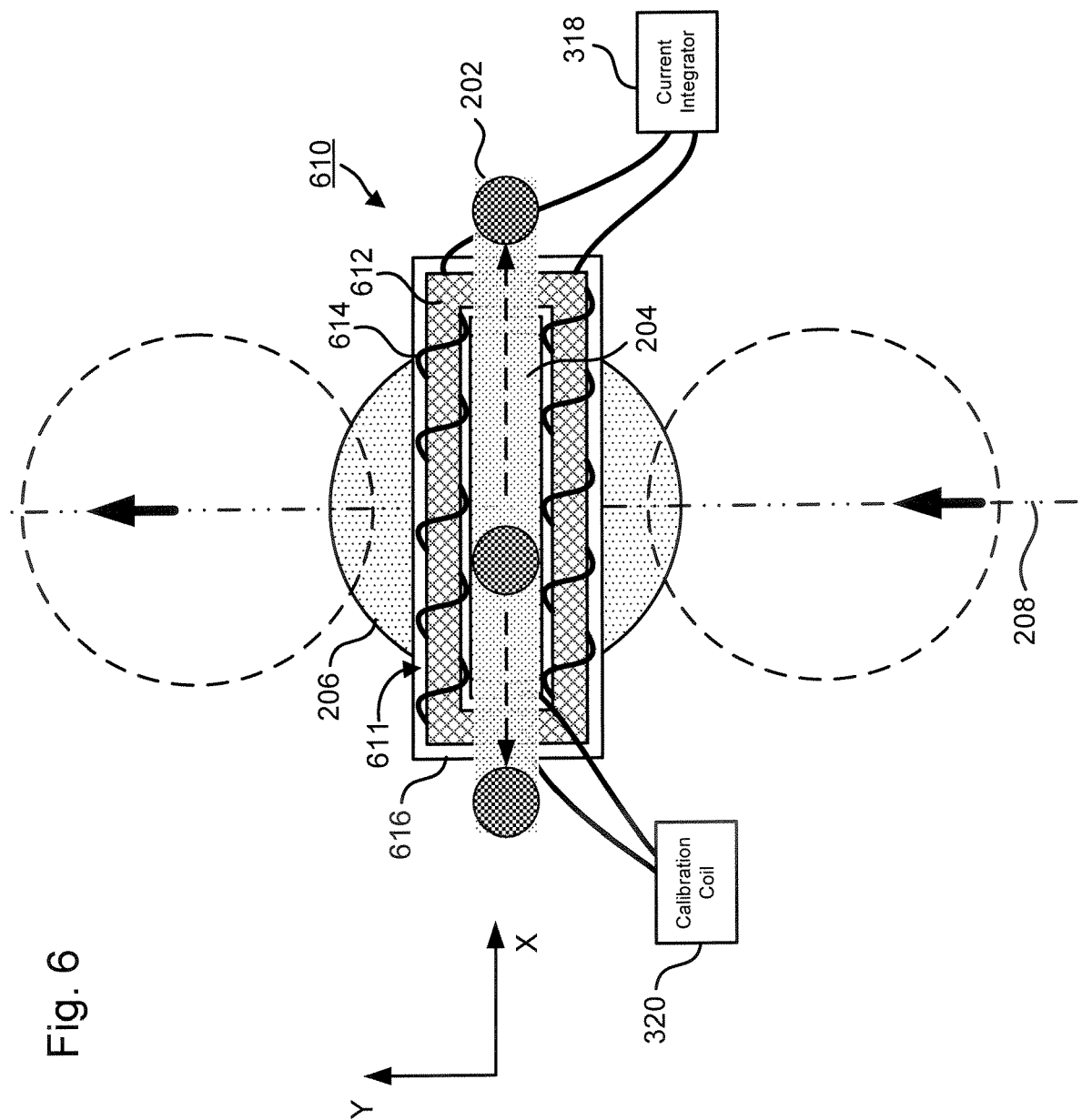
FIG. 6 depicts an exemplary scanning beam current transformer configuration in accordance with an embodiment of the present disclosure.
Figure 8:
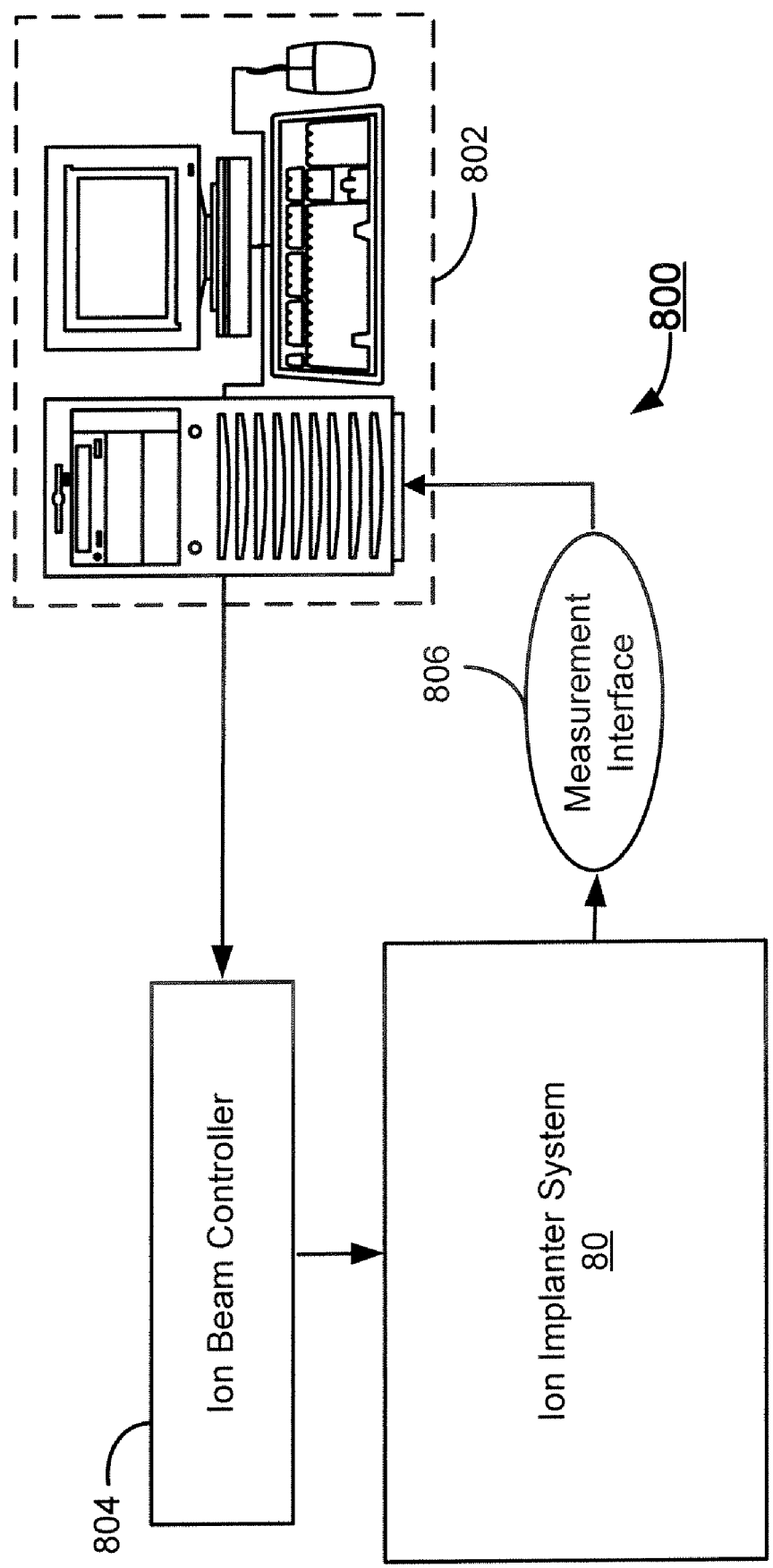
FIG. 8 depicts an exemplary dose control system for ion implantation in accordance with an embodiment of the present disclosure.

Referring to FIG. 6, a top view of a current monitor 610 is shown in accordance with another embodiment of the present disclosure. Similar to FIG. 3A, the current monitor 610 may include a transformer 611 having a core 612 and a coil 614 wrapped around the core 612. The current monitor 510 may be connected to a current integrator 318 through wires of the coil 614. The current integrator 318 may be connected to a dose control system 800, as depicted in FIG. 8. A calibration coil 320 may wrap around the current monitor 610. In one embodiment, the calibration coil 320 may include a single turn and provide the current monitor 610 with a simulated beam current, which may be useful for calibrating the current monitor 310. In another embodiment, the calibration coil 620 may include a predetermined number of turns for more reliable and accurate calibration.

However, in this embodiment, unlike FIG. 3A, the transformer 611 may have a rectangular shape and may be positioned within a transformer casing 616, which may also be rectangular in shape. The transformer casing 616 may be formed of an electrically conductive, non-magnetic material, such as graphite or aluminum, and may be used as a shield or protective covering for the transformer 611. Other various materials may also be utilized. Furthermore, in yet another embodiment, the transformer casing 616 may be symmetrically grounded. This may ensure a short path to ground as well as no generation of azimuthal currents when the ion beam scans across the transformer casing 616.

One benefit with utilizing a rectangular-shaped transformer 611, as depicted in FIG. 6, may include a reduced size of the current monitor. Having a smaller beam-to-core distance may increase the magnetic field induction B and, therefore (implicitly), increase the magnetic flux Φ since the magnetic field B is inversely proportional with the distance from the current. A drawback with a rectangular-shaped transformer 611, however, may include losses associated with sharp corners of the core 612. As a result, other embodiments may be provided to balance the size of the transformer 611 with the magnetic field produced.

For example, referring to FIG. 7, a top view of a current monitor 710 is shown in accordance with another embodiment of the present disclosure. Similar to FIG. 6, the current monitor 710 may include a transformer 711 having a core 712 and a coil 714 wrapped around the core 712. The current monitor 710 may be connected to a current integrator 318 through wires of the coil 714. The current integrator 318 may be connected to a dose control system 800, as depicted in FIG. 8. A calibration coil 320 may wrap around the current monitor 710. In one embodiment, the calibration coil 320 may include a single turn and provide the current monitor 710 with a simulated beam current, which may be useful for calibrating the current monitor 710. In another embodiment, the calibration coil 320 may include a predetermined number of turns for more reliable and accurate calibration.

However, in this embodiment, unlike FIGS. 3A and 6, the transformer 711 may have an elliptical shape and may be positioned within a transformer casing 716, which may also be elliptical in shape. The transformer casing 716 may be formed of an electrically conductive, non-magnetic material, such as graphite or aluminum, and may be used as a shield or protective covering for the transformer 711. Other various materials may also be utilized. Furthermore, in yet another embodiment, the transformer casing 716 may be symmetrically grounded. This may ensure a short path to ground as well as no generation of azimuthal currents when the ion beam scans across the transformer casing 716.

The current monitor 710 with the transformer 711 having an elliptical shape may provide a smaller beam-to-core distance as compared to the annular toroidal transformer 311 of FIG. 3A and a reduction in losses (e.g., from sharp corners) as compared to the rectangular-shaped transformer 611 of FIG. 6.

FIG. 8 depicts an exemplary dose control system 800 for ion implantation in accordance with an embodiment of the present disclosure. The system 800 may comprise a processor unit 802 (e.g., a dose controller) which may be a microprocessor, micro-controller, personal computer (PC), or any other processing device. The system 800 may also comprise a beam movement controller 804 that controls the movement of an ion beam in an ion implanter system 80 according to instructions received from the processor unit 802. The system 800 may further comprise a measurement interface 806 through which the processor unit 802 may receive ion beam measurement data (e.g., beam current, dose and shape) from the ion implanter system 80. The measurement interface 806 may include or be coupled to one or more measurement devices. The system 800 may be used to set up a 2-D velocity profile for beam movement, to control an ion implantation process based on the 2-D velocity profile, and to provide real-time, closed-loop adjustments to the 2-D velocity profile. Furthermore, the system 800 may provide dose control at the ion implanter system 80 based on the ion beam current measurements obtained from a current monitor, e.g., a scanning beam current monitor.

One advantage with utilizing embodiments of a current monitor in accordance with embodiments of the present disclosure may include increased accuracy in ion beam current measurements at a wafer. Because the current monitor is non-intercepting and measures ion beam current directly bombarding the wafer, accurate ion beam current measurements may be obtained. Another factor contributing to increased accuracy may include the fact that current-to-area ratio calculations are no longer necessary for current monitors of the present disclosure. Ion beam drift effects on dose and acceptance angle errors may also be eliminated to ultimately provide a more accurate ion beam measurement. Also, since the current monitor is non-intercepting, not only is accuracy optimized, but real-time ion beam current measurements may also be obtained.

Another advantage of the present disclosure is that a current monitor in accordance with embodiments of the present disclosure may be integrated with existing electronics. This may lead to reduced costs associated with implementing the current monitor with current systems not only to provide accurate ion beam measurements but also for dose compensation.

Furthermore, since a current monitor in accordance with embodiments of the present disclosure involves no moving parts, little or no maintenance may be required. Therefore, consistency and reliability of ion beam current measurements and dose compensation may be achieved with relative regularity.

Other advantages of the present disclosure may include an increase in ion beam utilization and availability of external calibration. These features may serve to reduce costs and improve measurements and calculations.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. An apparatus for ion implantation, the apparatus comprising:
    a measurement device positioned adjacent a wafer, wherein the measurement device comprises a transformer through which an ion beam passes onto the wafer; and
    an ion dose control module, coupled to the measurement device, to calculate ion beam current passing through the transformer and adjust dose based at least in part upon the calculated ion beam current, the ion dose control module configured to control movement of the ion beam across the wafer according to a scan path that extends beyond an inner periphery of the transformer while the wafer is translated during implantation.

2. The apparatus of claim 1, wherein the ion dose control module comprises a current integrator to calculate the ion beam current passing through the transformer.

3. The apparatus of claim 1, further comprising a calibration coil, coupled to the measurement device, to provide simulated ion beam current for calibrating the ion dose control module.

4. The apparatus of claim 1, wherein the transformer comprises a core with a coil wrapped around the core.

5. The apparatus of claim 1, wherein the measurement device further comprises a casing for the transformer, wherein the easing comprises an electrically conductive, non-magnetic material.

6. The apparatus of claim 5, wherein the electrically conductive, non-magnetic material comprises at least one of graphite and aluminum.

7. The apparatus of claim 1, wherein the transformer is in the shape of an annular toroid, a rectangular toroid, or an elliptical toroid.

8. The apparatus of claim 1, wherein the ion beam current is measured in real-time.

9. A method for ion implantation, the method comprising:
    positioning a wafer adjacent to a measurement device having a transformer;
    passing an ion beam through the transformer onto the wafer;
    calculating, at an ion dose control module, ion beam current passing through the transformer;
    controlling movement of the ion beam across the wafer with the ion dose control module according to a scan path that permits the ion beam to sweep beyond an inner periphery of the transformer while the wafer is translated during implantation; and
    adjusting, at the ion dose control module, ion dose based at least in part upon the ion beam current.

10. The method of claim 9, wherein the ion dose control module comprises a current integrator to calculate the ion beam current passing through the transformer.

11. The method of claim 9, further comprising providing simulated ion beam current for calibrating the ion dose control module using a calibration coil coupled to the measurement device.

12. The method of claim 9, wherein the transformer comprises a core with a coil wrapped around the core.

13. The method of claim 9, wherein the measurement device further comprises a casing for the transformer, wherein the easing comprises electrically conductive, non-magnetic material.

14. The method of claim 13, wherein the electrically conductive, non-magnetic material comprises at least one of graphite and aluminum.

15. The method of claim 9, wherein the transformer is in the shape of an annular toroid, a rectangular toroid, or an elliptical toroid.

16. The method of claim 9, wherein the ion beam current is measured in real-time.

* * * * *